(12) United States Patent  
Cao et al.

(10) Patent No.: US 9,362,178 B1  
(45) Date of Patent: Jun. 7, 2016

(54) FINFET INCLUDING VARIED FIN HEIGHT

(71) Applicant: International Business Machines Corporation, Armonk, NY (US)

(72) Inventors: Qing Cao, Yorktown Heights, NY (US); Kangguo Cheng, Schenectady, NY (US); Zhengwen Li, Scarsdale, NY (US); Fei Liu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/745,736

(22) Filed: Jun. 22, 2015

Related U.S. Application Data

(63) Continuation of application No. 14/674,145, filed on Mar. 31, 2015.

(51) Int. Cl.  
*H01L 21/8238* (2006.01)  
*H01L 21/3065* (2006.01)  
*H01L 21/02* (2006.01)

(52) U.S. Cl.  
CPC .. *H01L 21/823807* (2013.01); *H01L 21/02532* (2013.01); *H01L 21/3065* (2013.01); *H01L 21/823821* (2013.01); *H01L 21/823878* (2013.01)

(58) Field of Classification Search  
CPC ............ H01L 21/02532; H01L 21/3065; H01L 21/823807; H01L 21/823821; H01L 21/823878; H01L 29/0657; H01L 29/66795; H01L 29/785; H01L 29/7858  
See application file for complete search history.

(56) References Cited

U.S. PATENT DOCUMENTS

| | | | |
|---|---|---|---|
| 8,361,894 B1* | 1/2013 | Hargrove | H01L 21/845 257/E21.4 |
| 9,093,302 B2* | 7/2015 | Xie | H01L 27/0886 |
| 2006/0151834 A1* | 7/2006 | Anderson | H01L 21/84 257/347 |
| 2007/0218628 A1* | 9/2007 | Orlowski | H01L 21/845 438/254 |
| 2013/0062699 A1* | 3/2013 | Zhu | H01L 29/66795 257/368 |
| 2013/0175618 A1* | 7/2013 | Cheng | H01L 21/823431 257/347 |
| 2014/0124860 A1* | 5/2014 | Cheng | H01L 21/845 257/347 |
| 2015/0129934 A1* | 5/2015 | Xie | H01L 27/0886 257/192 |
| 2015/0187766 A1* | 7/2015 | Basker | H01L 27/0886 257/365 |
| 2015/0228722 A1* | 8/2015 | Chung | H01L 29/0657 257/401 |

OTHER PUBLICATIONS

Cao et al., "FinFET Including Varied Fin Height", U.S. Appl. No. 14/674,145, filed Mar. 31, 2015.  
List of IBM Patents or Patent Applications Treated as Related; (Appendix P), Filed Jul. 21, 2015; 2 pages.

* cited by examiner

*Primary Examiner* — Allan R Wilson  
(74) *Attorney, Agent, or Firm* — Cantor Colburn LLP; Vazken Alexanian

(57) ABSTRACT

According to another embodiment, a semiconductor finFET device includes a semiconductor substrate. The finFET device further includes at least one first semiconductor fin on the semiconductor substrate. The first semiconductor fin comprises a first semiconductor portion extending to a first fin top to define a first height, and a first insulator portion interposed between the first semiconductor portion and the semiconductor substrate. A second semiconductor fin on the semiconductor substrate has a second semiconductor portion extending to a second fin top to define a second height, and a second insulator portion interposed between the second semiconductor portion and the semiconductor substrate, the second height being different from the first height.

13 Claims, 12 Drawing Sheets

FINFET INCLUDING VARIED FIN HEIGHT

DOMESTIC PRIORITY

This application is a continuation of U.S. patent application Ser. No. 14/674,145, filed Mar. 31, 2015, the disclosure of which is incorporated by reference herein in its entirety.

BACKGROUND

The present invention relates generally to semiconductor devices, and more particularly to fin-type field-effect transistors (finFETs).

To meet the continued demand for scale-reduced integrated circuits having increased speeds, it is necessary to design transistors that have higher drive currents with smaller dimensions. The development of fin-type field-effect transistors (finFETs) provides transistors with increased channel widths that achieve drive currents that are proportional to the channel widths. However, the width quantization effect of the device, i.e., the effective device width, is typically required to be an integral of a single fin perimeter. In addition, static random-access memory (SRAM) applications typically include both n-type finFETs (nFETs) and p-type finFETs (pFETs), where the nFET has a greater drive current, i.e., a non-integral ratio, with respect to the pFET. The non-integral ratio between the nFET and the pFET is difficult to achieve due to the quantization effect mentioned above. Recent efforts to address the non-integral ratio have included attempts to adjust the vertical height of the semiconductor fins. However, conventional methods for adjusting the semiconductor fin height during the fabrication process has proven to create fm-height and gate stack topographical variations.

SUMMARY

According to at least one embodiment of the present invention, a method of fabricating a finFET semiconductor device comprises forming a plurality of semiconductor fins on a semiconductor substrate, at least one first semiconductor fin among the plurality of semiconductor fins including a first lower semiconductor portion and a first upper semiconductor portion, and at least one second semiconductor fin including a second lower semiconductor portion and a second upper semiconductor portion. The method further includes etching the first lower semiconductor portion to form a first cavity having a first cavity height extending between the semiconductor substrate and a first upper semiconductor portion, and etching the second lower semiconductor portion to form a second cavity height extending between the semiconductor substrate and a second upper semiconductor portion, the second cavity height being different from the first cavity height. The method further includes filling the first cavity and the second cavity with an insulator material such that a first height of the first upper semiconductor portion is different than a second height of the second upper semiconductor portion.

According to another embodiment, a semiconductor fin-FET device includes a semiconductor substrate. The finFET device further includes at least one first semiconductor fin on the semiconductor substrate. The first semiconductor fin comprises a first semiconductor portion extending to a first fin top to define a first height, and a first insulator portion interposed between the first semiconductor portion and the semiconductor substrate. A second semiconductor fin on the semiconductor substrate has a second semiconductor portion extending to a second fin top to define a second height, and a second insulator portion interposed between the second semiconductor portion and the semiconductor substrate, the second height being different from the first height.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification.

FIGS. 1-9C are a series of views illustrating a method of forming a finFET device according to exemplary embodiments of the present teachings, in which:

FIG. 1 is a cross sectional view of a starting semiconductor substrate including a bulk semiconductor layer, a first semiconductor epitaxy layer on an upper surface of the bulk semiconductor layer, and a second semiconductor epitaxy layer on an upper surface of the first semiconductor epitaxy layer;

FIG. 2 illustrates the semiconductor substrate of FIG. 1 after patterning a masking layer formed on an upper surface of the second semiconductor epitaxy layer;

FIG. 3 illustrates the semiconductor substrate of FIG. 2 after recessing first portions of the second semiconductor epitaxy layer and the first semiconductor epitaxy layer at a first region with respect to second portions of the second semiconductor epitaxy layer and the first semiconductor epitaxy layer at a second region;

FIG. 4 illustrates the semiconductor substrate of FIG. 3 after growing a third semiconductor epitaxy layer on the exposed surfaces of the first semiconductor epitaxy layer and the second semiconductor epitaxy layer;

FIG. 6 is a top-view of the semiconductor device illustrated in FIGS. 5A-5B after removing an upper surface of a gate stack formed on the semiconductor substrate to expose a portion of the underlying semiconductor fins;

FIG. 7 is a cross-sectional view of the semiconductor substrate of FIG. 6 taken along line A-A' following an etching process that removes the first semiconductor epitaxy layer to form a cavity between each semiconductor fin and the shallow trench isolation layer;

FIG. 8 illustrates the semiconductor substrate of FIG. 6 after forming an insulator material in the cavities to extend between the semiconductor fins and the semiconductor substrate;

FIG. 9C illustrates cross-sectional views of the semiconductor device of FIG. 9A showing a cross-sectional view of the pFET region taken along line C1-C1' and a cross-sectional view of the nFET region taken along line C2-C2'.

DETAILED DESCRIPTION

Various non-limiting embodiments provide a finFET semiconductor device that includes a plurality of semiconductor fins having varied fin heights. Accordingly, a greater drive current can be delivered through a first plurality of semiconductor fins having an increased height with respect to a second plurality of semiconductor fins such that a non-integral ratio can be achieved. Moreover, the top surfaces of all the semiconductor fins are at or substantially at the same level such that variations in gate stack topography between the nFET region and the pFET region are avoided.

Figure 1:
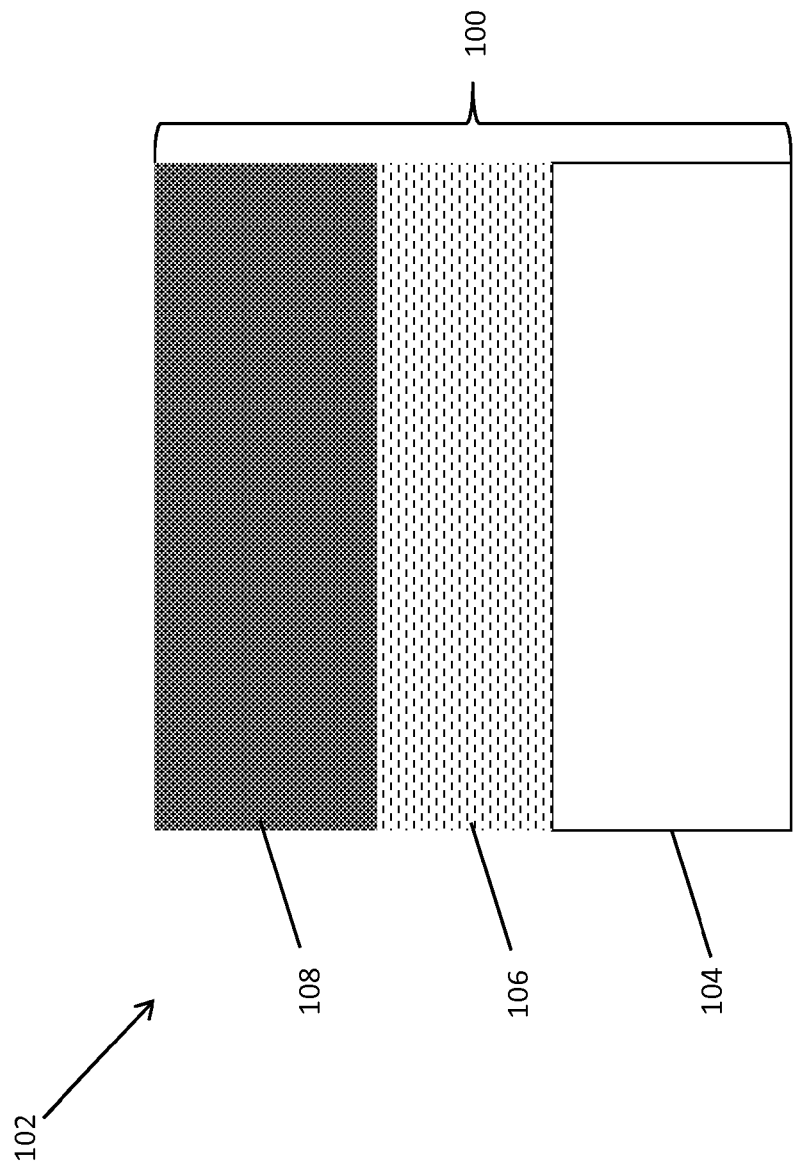

With reference now to FIG. 1, a starting substrate 100 of a semiconductor device 102 is illustrated according to a non-limiting embodiment. A first epitaxy semiconductor layer 106 is formed on an upper surface of a bulk substrate layer 104 and a second epitaxy semiconductor layer 108 is formed on an upper surface of the first epitaxy semiconductor layer 106. The bulk substrate layer 104 can be formed from various semiconductor materials including, but not limited to, silicon (Si). The first epitaxy semiconductor layer 106 is formed, for example, by epitaxially growing a semiconductor material such as, for example, silicon germanium (SiGe). The second epitaxy semiconductor layer 108 is formed, for example, by epitaxially growing a second semiconductor material on an upper surface of the first semiconductor epitaxy layer 106. According to an embodiment, the second semiconductor epitaxy layer 108 is different from the first semiconductor epitaxy layer 106. For example, the second semiconductor epitaxy layer 108 is formed by epitaxially growing silicon (Si) on an upper surface of the first semiconductor epitaxy layer 106 formed from silicon germanium (SiGe).

Figure 2:
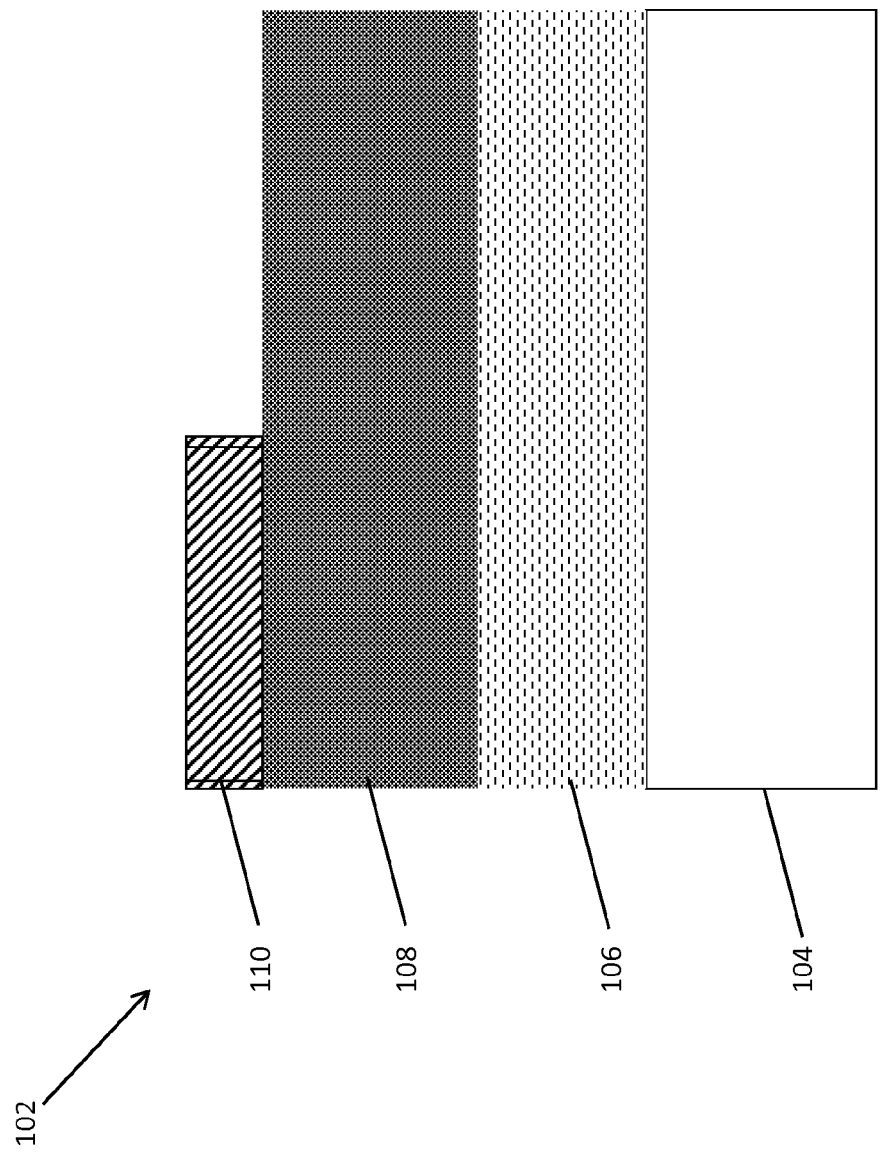

Referring now to FIG. 2, a masking layer 110 is formed on an upper surface of the second epitaxy layer 108. The masking layer 110 may be selected from various hard mask materials including, for example, silicon nitride (SiN). The masking layer 110 can be patterned using various techniques including, for example, well-known photolithography techniques such that a portion of the second epitaxy layer 108 is exposed as further illustrated in FIG. 2.

Figure 3:
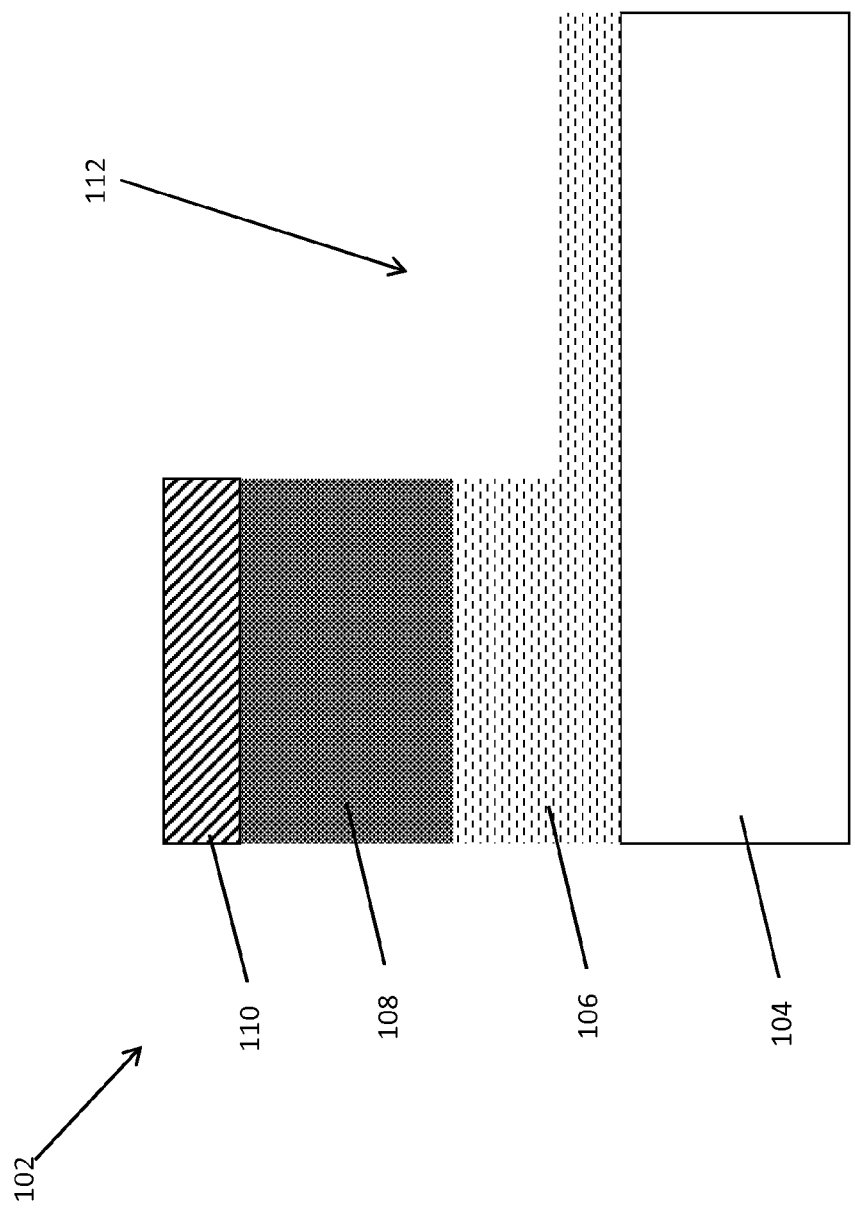

Referring to FIG. 3, one or more etching processes are performed such that a trench 112 extends through a portion of the second epitaxy layer 108 and partially through the first epitaxy layer 106. Accordingly, the portion of the first epitaxy layer 106 that is not covered by the hard mask 110 is recessed below remaining protected portions of the first epitaxy layer 106 and the second epitaxy layer 108. Various etching techniques may be used to form the trench 112 as understood by one of ordinary skill in the art. For example, a timed reactive ion etch (RIE) process may be performed. The timed RIE process can be applied for a predetermined amount of time such that when the etching time expires, the portion of the uncovered first epitaxy layer 106 is recessed below the remaining portions of the first epitaxy layer 106 and second epitaxy layer 108. According to another embodiment, a first point detection etch process that is selective to germanium (Ge) is applied first to the uncovered second epitaxy layer 108. The point detection etching process is then stopped when the underlying first epitaxy layer 106 (i.e., the SiGe epitaxy layer 106) is reached. A second timed RIE process is then performed for a predetermined amount of time such that the exposed first epitaxy layer 106 (i.e., the SiGe epitaxy layer 106) is recessed below the remaining covered first epitaxy layer 106 and second epitaxy layer 108.

Figure 4:
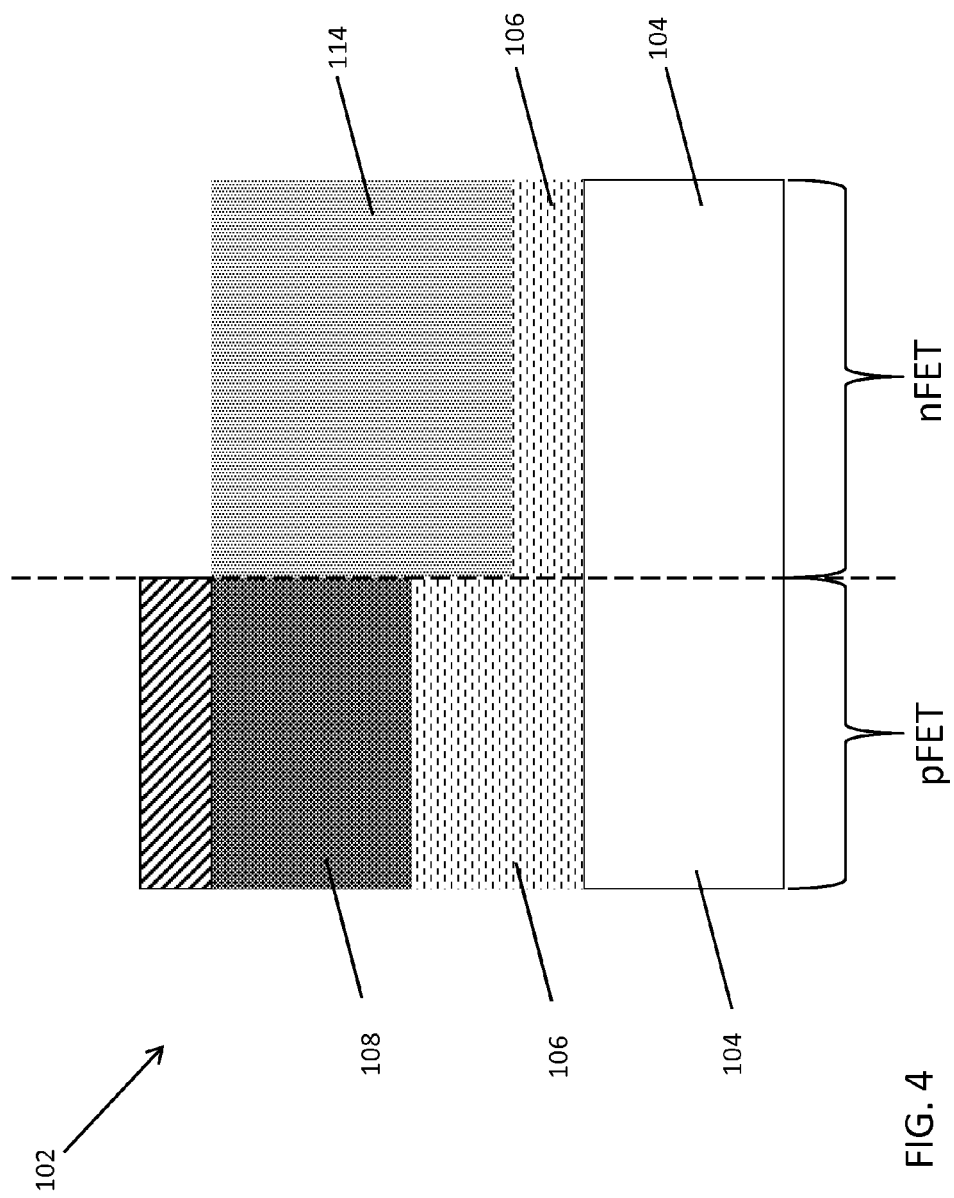

Turning now to FIG. 4, a third epitaxy semiconductor layer 114 is formed on an upper surface of the recessed first epitaxy layer 106 and also on side walls of the remaining first epitaxy layer 106 and second epitaxy layer 108. The third epitaxy layer 114 is formed, for example, by epitaxially growing silicon (Si) from the first epitaxy layer 106 and the second epitaxy layer 108. The upper surface of the third epitaxy layer 114 is formed flush, or substantially flush, with an upper surface of the second epitaxy layer 108. Accordingly, a semiconductor device 102 is formed having a silicon germanium layer 106 interposed between a first silicon layer 108 and a bulk substrate layer 104 to define a first semiconductor region, and the silicon germanium layer 106 interposed between a second silicon layer 114 and the bulk semiconductor layer 104 to define a second semiconductor region.

According to at least one embodiment, the upper surface of the third epitaxy layer 114 is formed flush with the upper surface of the second epitaxy layer 108 by controlling the epitaxy process such that epitaxy stops once the crystal growth reaches the same level as the upper surface of the second epitaxy layer 108. In another embodiment, the upper surface of the third epitaxy layer 114 is formed flush with the upper surface of the second epitaxy layer 108 by first overgrowing the second epitaxy layer 108 above the upper surface of the masking layer 110, planarizing the second epitaxy layer 108 to the same level of the upper surface of the masking layer 110 (e.g., by chemically mechanical polishing), and then recessing the second epitaxy layer 108 so that epitaxy stops once it reaches the same level as the upper surface of the second epitaxy layer 108.

According to another embodiment, the third epitaxy layer 114 is formed from silicon germanium (SiGe). In this embodiment, however, the third epitaxy layer 114 has a lower percentage of germanium with respect to the percentage of germanium included in the first epitaxy layer 106. According to an embodiment, the first epitaxy layer 106 comprises, for example, 40% germanium, while the third epitaxy layer comprises, for example, 20% germanium. Accordingly, a semiconductor device 102 is formed with a first silicon germanium layer 106 interposed between a silicon layer 108 and a bulk substrate layer 104 to define a pFET region, and with the first silicon germanium layer 106 interposed between a second silicon germanium layer 114 and the bulk semiconductor layer 104 to define an nFET region. As mentioned above, an upper surface of the third epitaxy layer 114 is formed flush with an upper surface of the second epitaxy layer 108 since the third epitaxy layer 114 is grown only from semiconductor materials.

Figure 5A:
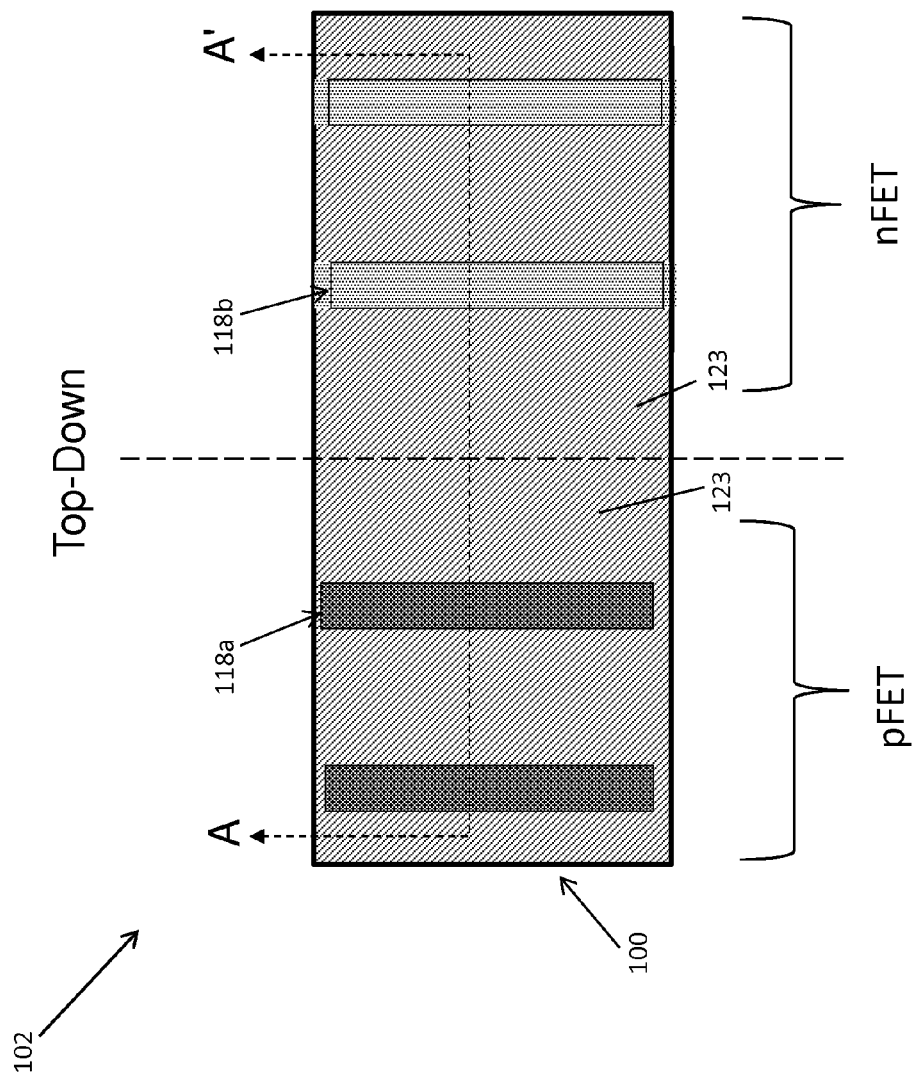
FIG. 5A is a top-view of the semiconductor substrate illustrated in FIG. 4 following a semiconductor fin patterning process that forms a first plurality of semiconductor fins at a pFET region of the semiconductor substrate and a second plurality of semiconductor fins at a nFET region of the semiconductor substrate.
Figure 5B:
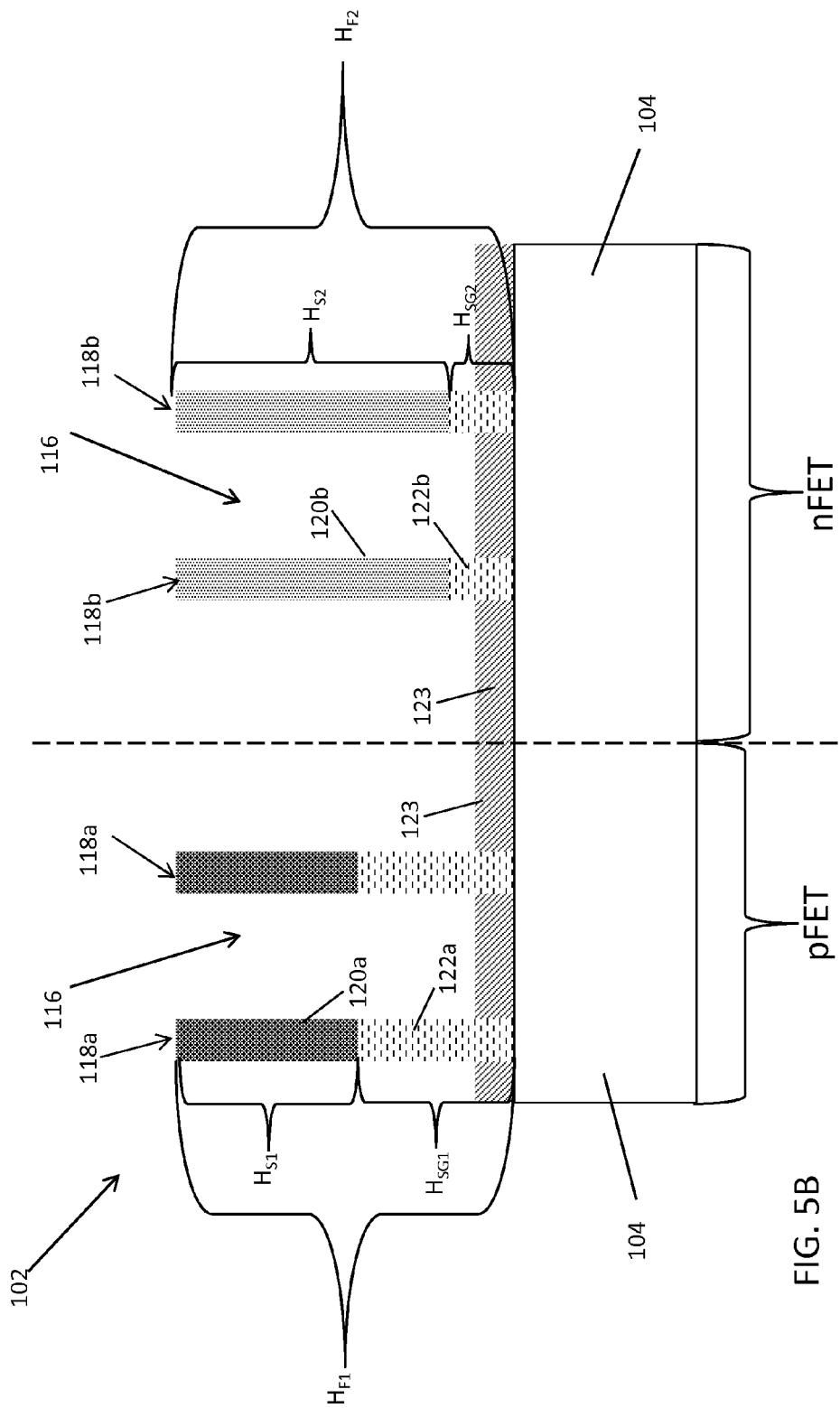
FIG. 5B is a cross-sectional view of the semiconductor substrate of FIG. 5A taken along line A-A'.

Turning to FIGS. 5A-5B, the previously formed hard mask layer 110 is removed from the upper surface of the first epitaxy layer 108 and a plurality of semiconductor fins 118a-118b is formed. More specifically, a first plurality of semiconductor fins 118a is formed in the pFET region, and a second plurality of semiconductor fins 118b is formed in the nFET region. Although fabrication of a semiconductor device 102 including both an nFET region and a pFET region is described, it should be appreciated that the plurality of semiconductor fins can be formed on a semiconductor device 102 having only a single pFET region or a single nFET region.

The semiconductor fins 118a-118b can be patterned using various techniques as understood by one of ordinary skill in the art including, but not limited to, side wall imaging transfer (SIT). According to a non-limiting embodiment, the first plurality of semiconductor fins 118a have a total fin height ($H_{F1}$), and include an upper epi portion 120a and a lower epi portion 122a. The upper epi portion 120a has a height ($H_{S1}$) and the lower epi portion 122a has a height ($H_{Sg1}$). The second plurality of semiconductor fins 118b has a total fin height ($H_{F2}$), and includes an upper epi portion 120b and a lower epi portion 122b. Since the upper surface of the third epitaxial layer is formed flush with the upper surface of the second epitaxially layer prior to patterning the semiconductor fins 118a-118b, the resulting semiconductor fins 118a-118b formed in both the pFET region and the nFET region are substantially aligned with one another along a horizontal axis. Accordingly, variations in gate stack topography between the nFET region and the pFET region can be avoided as discussed below.

The total fin height ($H_{F2}$) of the second plurality of semiconductor fins 118b is equivalent, or substantially equivalent, to the total fin height ($H_{F1}$) of the first plurality of semiconductor fins 118a. However, the first epi portion 120b of the second plurality of semiconductor fins 118b has a height ($H_{s2}$) that is greater than the height ($H_{S1}$) of the first epi portion 120a corresponding to the first plurality of semiconductor fins 118a. Thus, the lower epi portion 122b of the second plurality of semiconductor fins 118b has a height ($H_{Sg2}$) that is less than a height ($H_{Sg1}$) of the lower epi portion 122a corresponding to the first plurality of semiconductor fins 118a.

As further illustrated in FIG. 5, a shallow trench isolation (STI) region 123 is formed by depositing a dielectric material such as silicon dioxide ($SiO_2$), for example, on an upper surface of the bulk semiconductor layer 104 and in the fin trenches 116 located between the semiconductor fins 118a-118b. The dielectric material can be deposited using chemical vapor deposition, for example, and can be subsequently recessed using a chemical-mechanical planarization (CMP) technique to obtain a desired height of the dielectric material. Optionally, a liner (not shown) formed from silicon nitride, for example, can be formed between the semiconductor fins 118a-118b and the STI region 123.

According to an embodiment, the STI region 123 is formed using three process operations. First, a blanket of STI material such as an insulating oxide material, for example, is deposited in the fin trenches 116 and on the surfaces of the fins 118a-118b. Second, a first RIE process or a chemical-mechanical process (CMP) that stops on top of the fins 118a-118b is performed. Finally, the STI oxide is selectively recessed with respect to the semiconductor fins 118a-118b using a timed directional etching process such as a second timed direction RIE process. In this manner, the STI oxide is selectively recessed to the desired depth with respect to the semiconductor fins 118a-118b to form the STI region 123.

Figure 6:
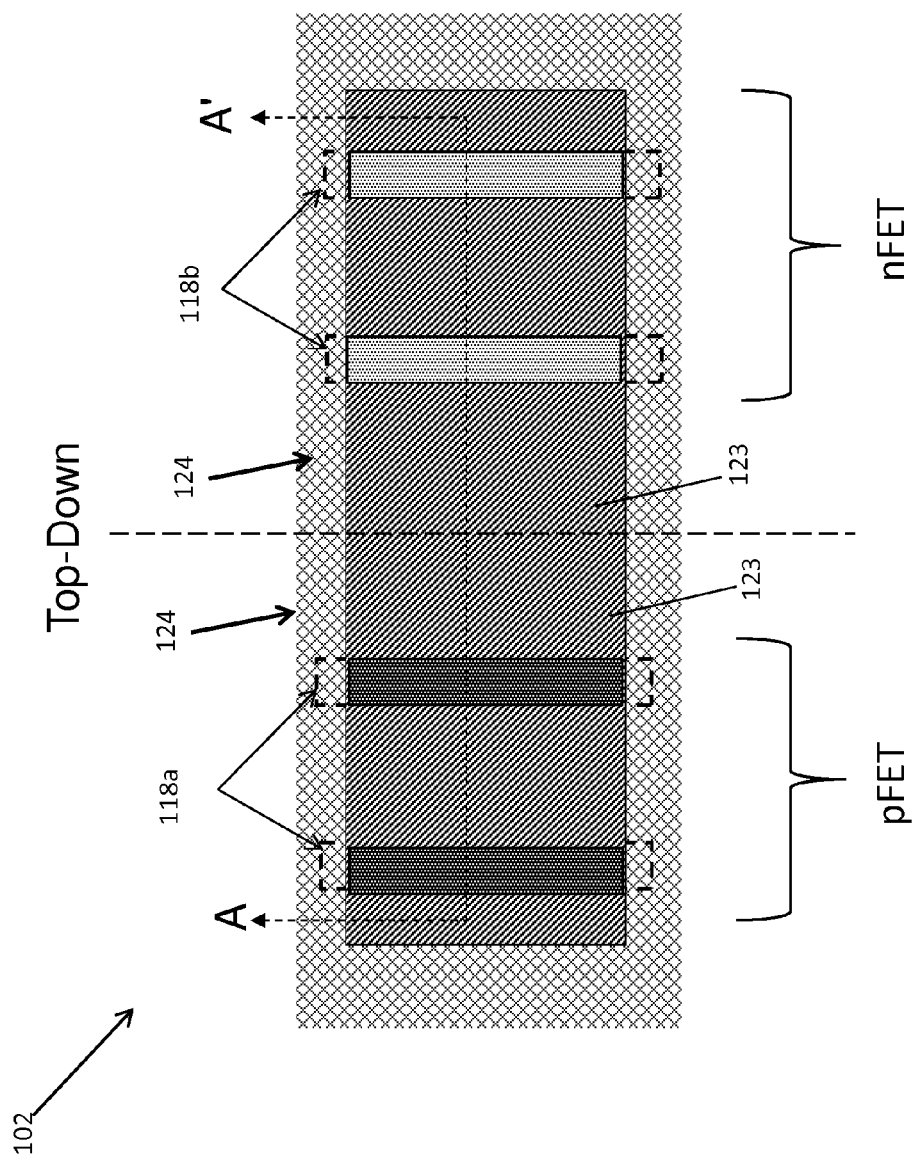

Referring to FIG. 6, a gate stack 124 is formed on an upper surface of the bulk semiconductor substrate layer 104 and which wraps around the outer surface of the semiconductor fins 118a-118b as understood by one of ordinary skill in the art. Since the upper surfaces of the semiconductor fins in both the pFET region and the nFET region are substantially aligned with one another along a horizontal axis such that variations in gate stack topography between the nFET region and the pFET region are avoided. That is, the gate height at the pFET region is equal to, or substantially equal to, the gate height at the nFET region.

As further illustrated in FIG. 6, an upper portion of the gate stack 124 is opened to reveal a middle portion of the semiconductor fins 118a-118b and also the underlying STI region 123. The end portions of the semiconductor fins 118a-118b, however, remain covered by the remaining portion of the gate stack 124. In this manner, the ends of semiconductor fins 118a-118b are anchored by the remaining gate stack 124.

Figure 7:
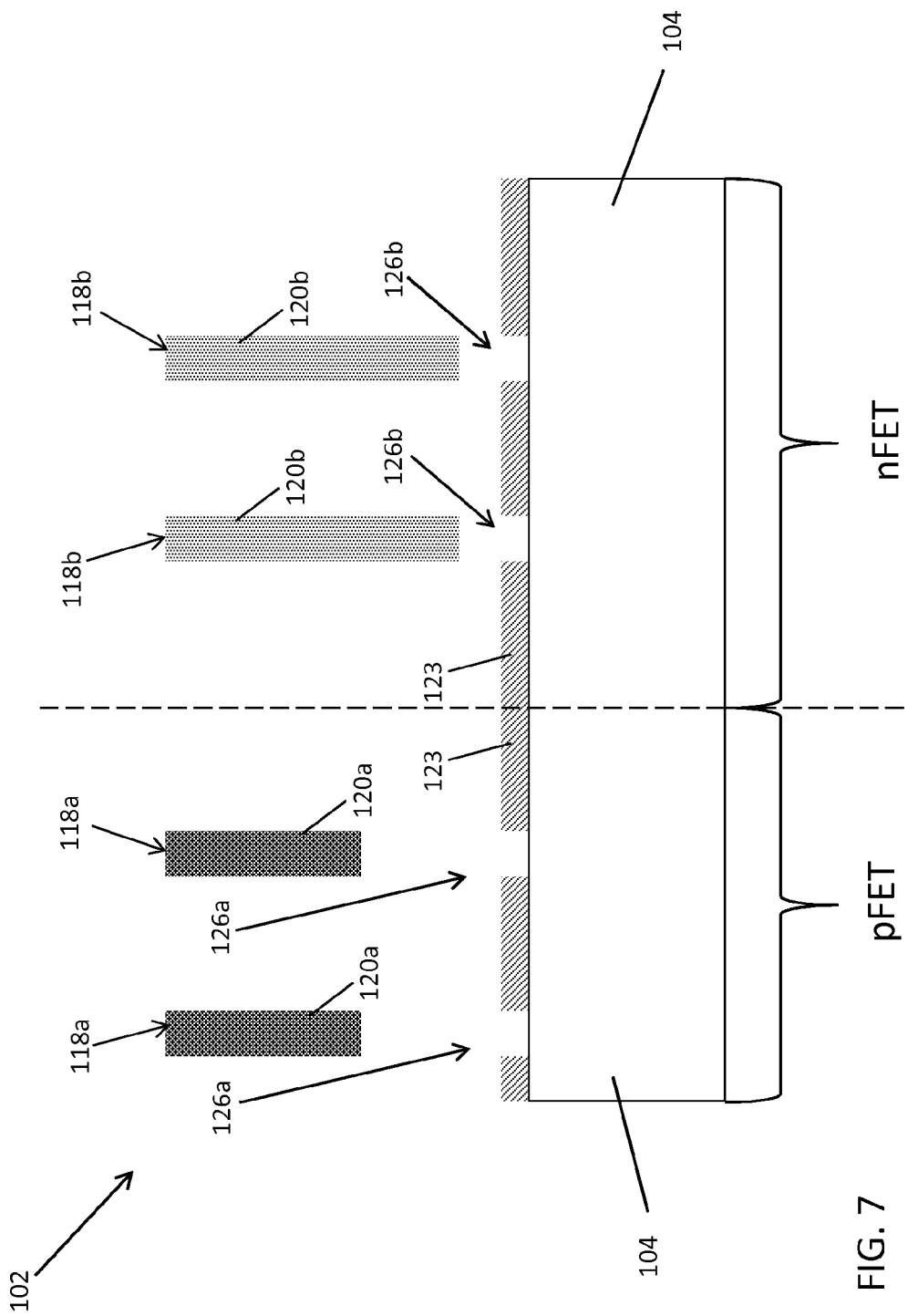

Turning to FIG. 7, an etching process is performed to remove the lower epi portion 122a-122b from the first semiconductor fins 118a and second semiconductor fins 118b, respectively. Since the ends of the semiconductor fins 118a-118b are covered by the remaining portion of the gate stack 124, the semiconductor fins 118a-118b are suspended above the STI region 123. In this manner, first cavities 124 are formed beneath the upper epi portion 120a of the first semiconductor fins 118a and in the STI region 123. Similarly, second cavities 124b are formed beneath the upper epi portion 120b of the second semiconductor fins 118b and in the STI region 123. A chemical vapor etching process that is selective to silicon (Si) may be used to selectively remove the lower epi portions 122a-122b. More specifically, the etch rate of SiGe when exposed to a chemical vapor etching process using, for example, hydrochloric (HCl) vapor or hydrofluoric (HF) vapor is higher than that of pure Si. Moreover, the etch rate of SiGe increases as the concentration of germanium (Ge) included in the lower epi portion 122a-122b is increased. Accordingly, the selectivity of the etch rate of the SiGe with respect to the Si increases as the concentration of germanium included in the lower epi portion 122a-122b is increased.

Figure 8:
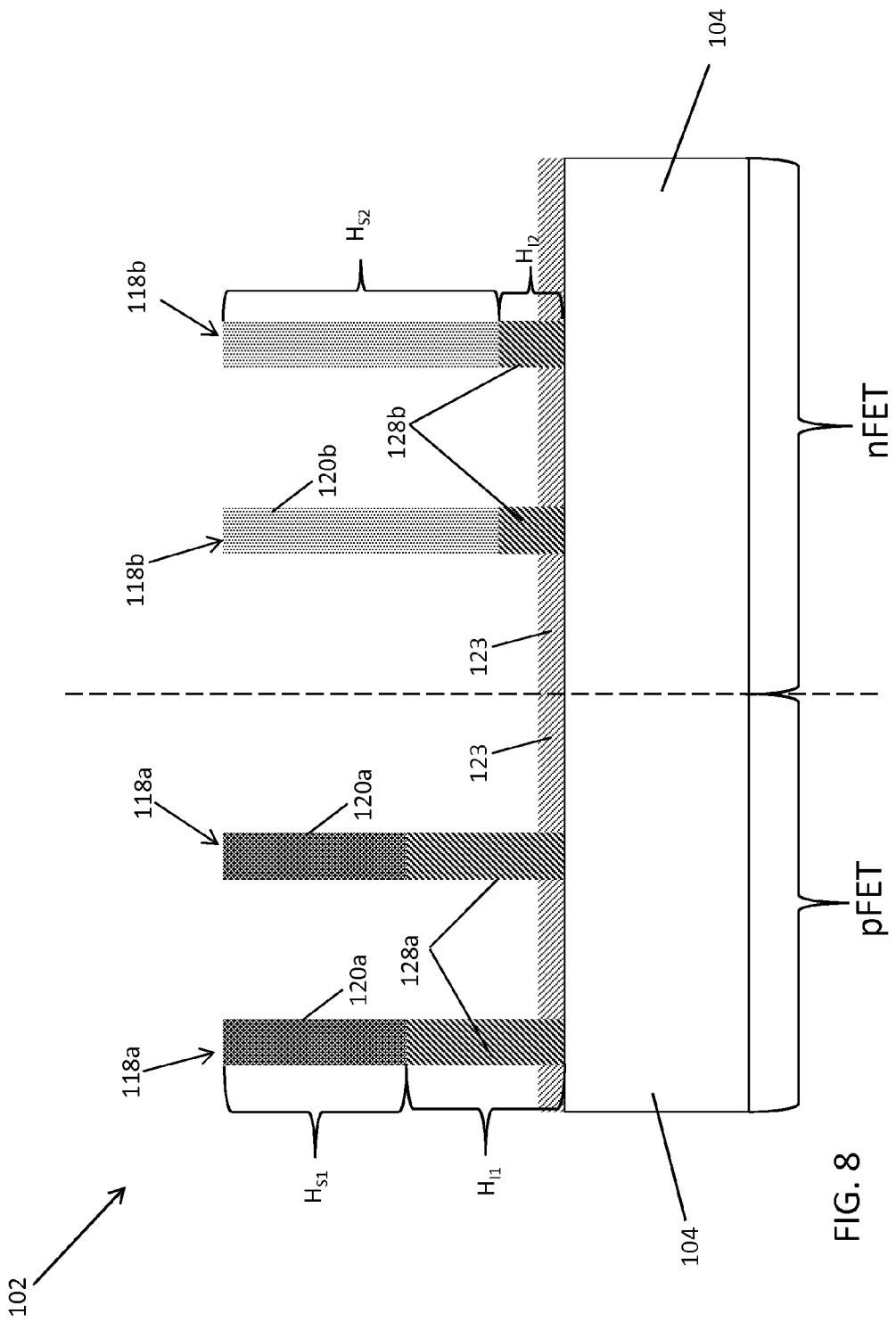

Turning now to FIG. 8, the cavities 126a-126b are backfilled with an insulator material 128a-128b. The insulator material 128a-128b may include various dielectric materials including, but not limited to, silicon dioxide ($SiO_2$). Although not shown, it should be appreciated that the insulator material may be blanket deposited in the cavities 126a-126b and filling the fin trenches located between the semiconductor fins 118a-118b. The insulator material 128a-128b may then be subsequently recessed using an etching process that is selective to a semiconductor material such as silicon, for example, as further illustrated in FIG. 8. As a result, a first plurality of semiconductor fins 118a formed in a pFET region have an insulator portion 128a interposed between an upper epi portion 120a and the bulk substrate layer 104. Similarly, a second plurality of semiconductor fins 118b formed in an nFET region include an insulator portion 128b interposed between an upper epi portion 120b and the bulk substrate layer 104.

Unlike the semiconductor fins 118a formed in the pFET region, however, the insulator portion 128b of the second semiconductor fins 118b has a height that is less than the height of the insulator material 128a corresponding to the first semiconductor fins 118a. In other words, the height of the upper epi portion 120b corresponding to the semiconductor fins 118b formed in the nFET region is greater than the height of the upper epi portion 120a corresponding to the semiconductor fins 118a formed in the pFET region. The upper epi portions 120a-120b essentially define the channels of the first and second semiconductor fins 118a-118b. In this manner, the semiconductor fins 118a-118b are formed having different channel heights such that a non-integral ratio is established between the semiconductor fins 118b formed in the nFET region and the semiconductor fins 118a formed in the pFET region.

Figure 9A:
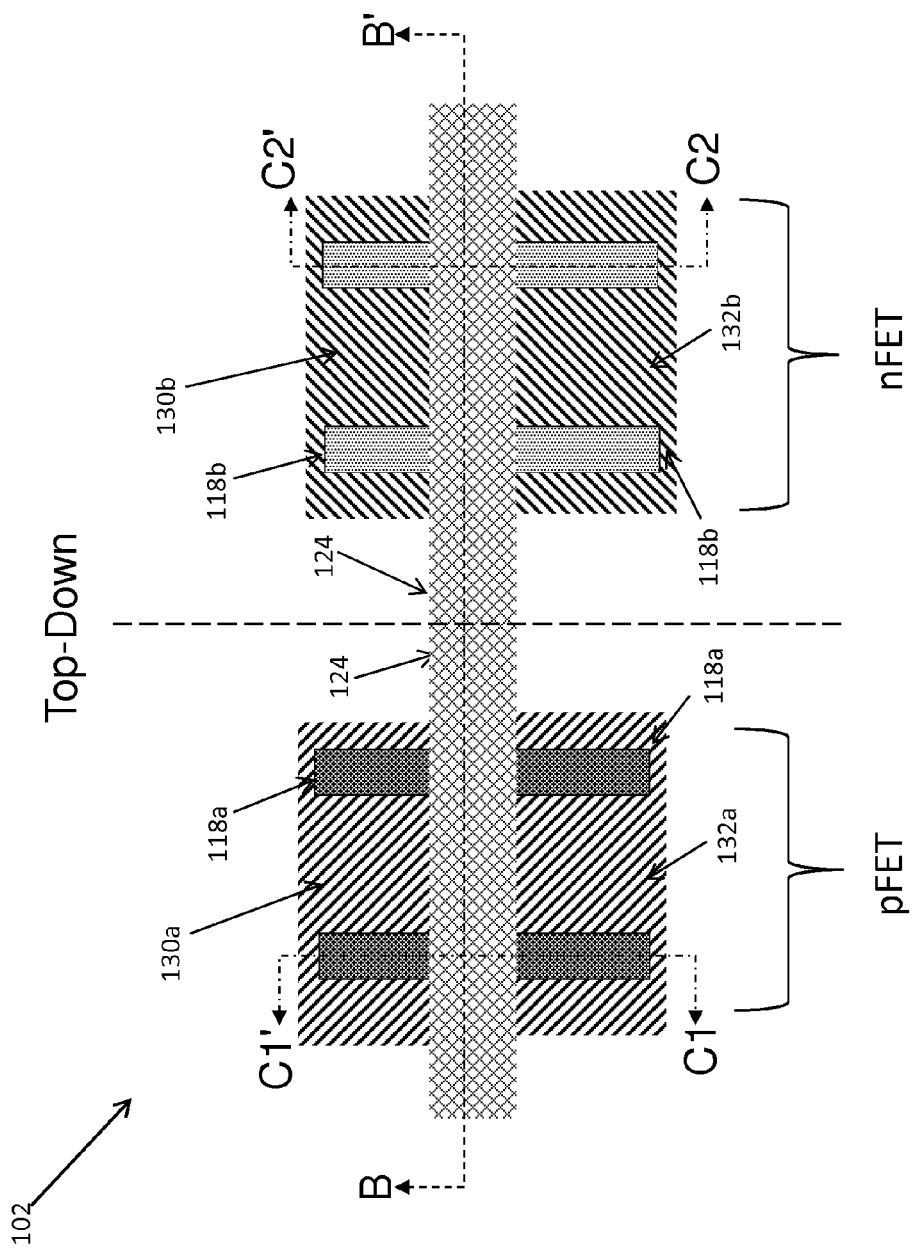
FIG. 9A is a top-down view of the semiconductor device shown in FIG. 8 after forming a gate stack that extends across an upper surface of the semiconductor fins and after epitaxially growing raised source/drain contacts that merge together the source and drain regions of the semiconductor fins, respectively.
Figure 9B:
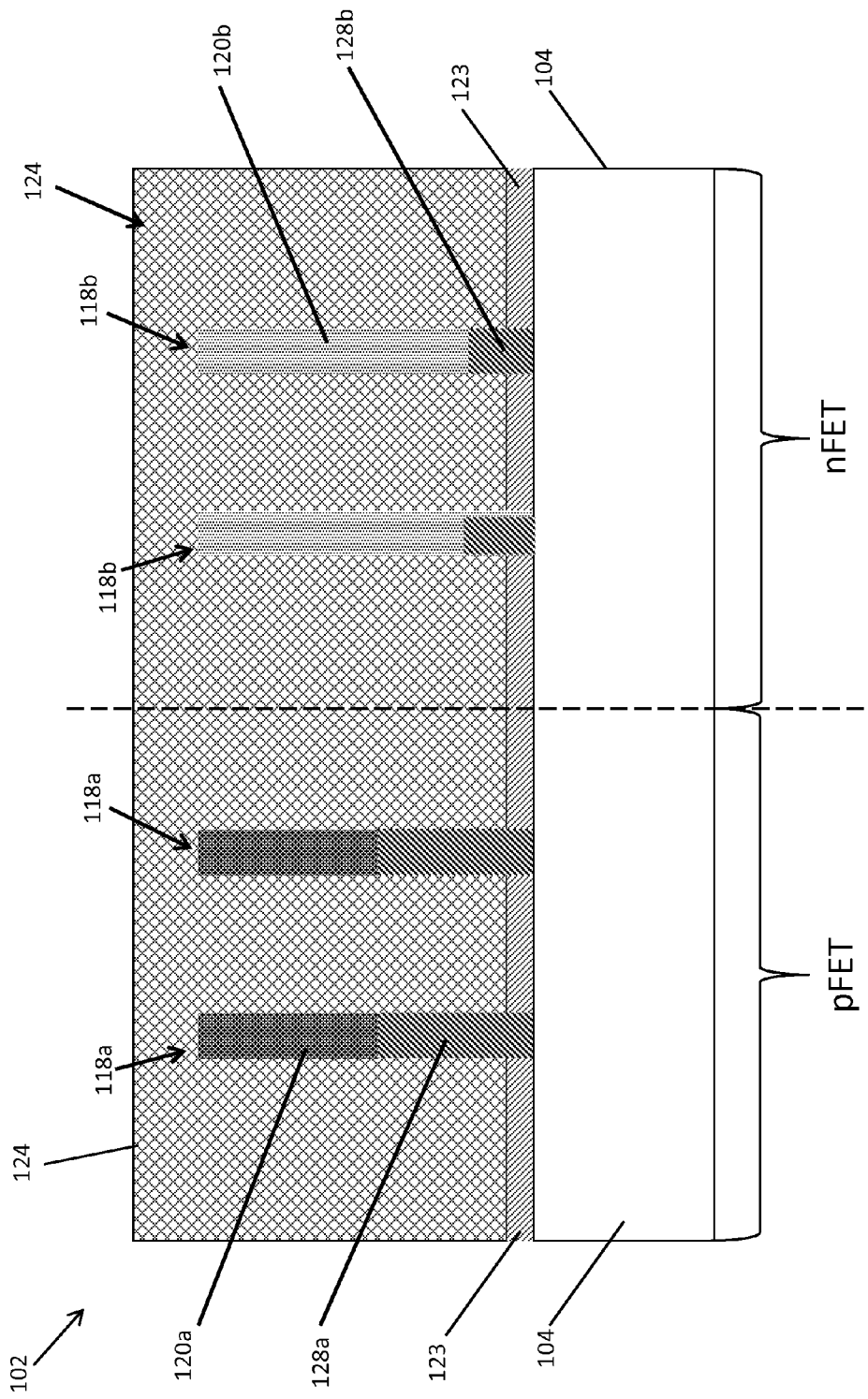
FIG. 9B is a cross-sectional view of the semiconductor device shown in FIG. 9A taken along line B-B'.
Figure 9C:
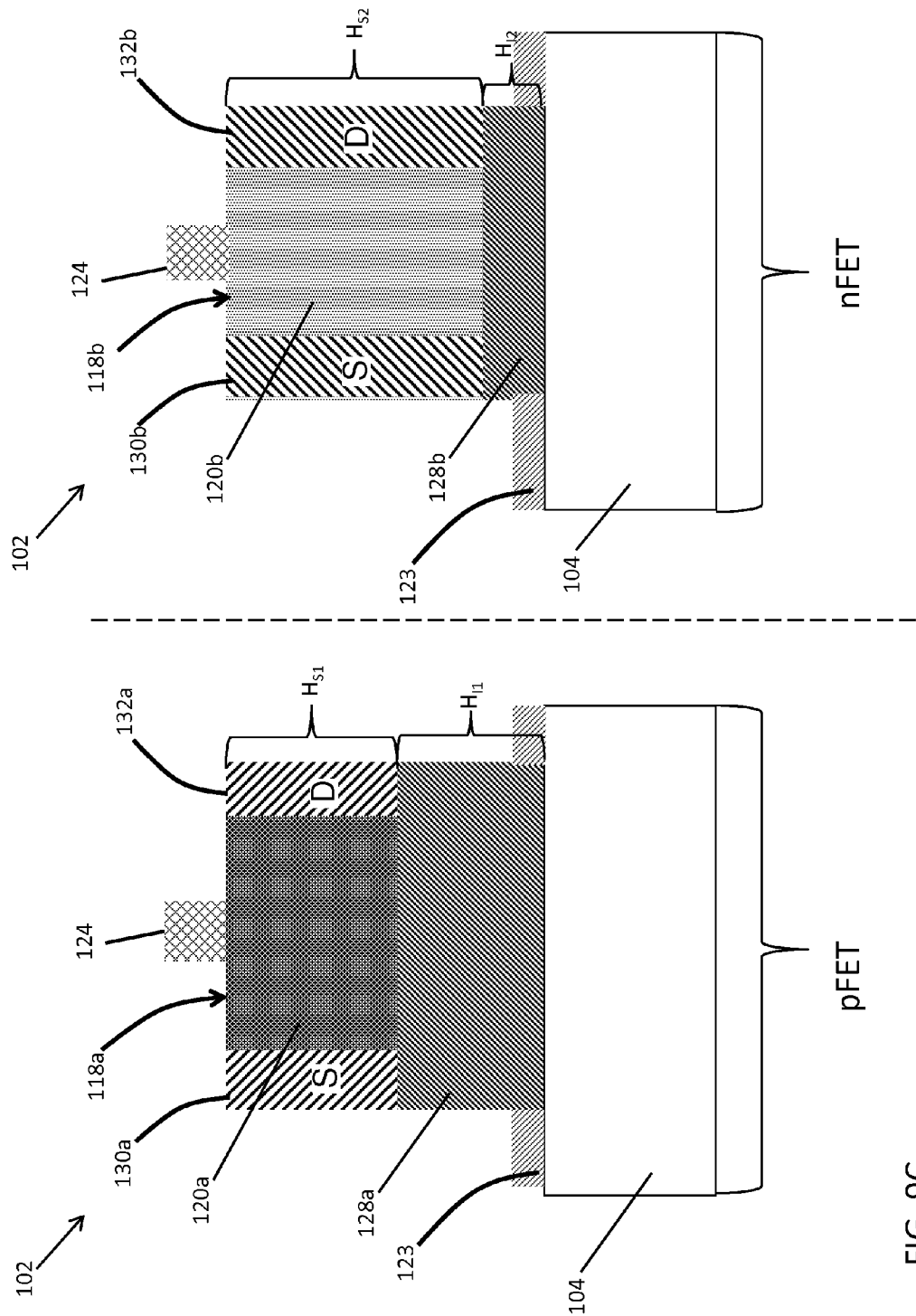

Referring now to FIGS. 9A-9C, a completed semiconductor device 102 is illustrated according to a non-limiting embodiment. The semiconductor device 102 includes a patterned gate stack 124 that extends along the middle portion of the semiconductor fins 118a-118b and wraps around the sidewalls and upper surface of the fins. Although not illustrated in detail in FIG. 9A, it should be appreciated that the gate stack 124 includes a gate electrode interposed between gate sidewalls as understood by one of ordinary skill in the art. The gate stack 124 can be patterned such that the source/drain regions of the semiconductor fins and the STI region 123 are exposed.

As further illustrated in FIG. 9A, raised source contact regions 130a-130b and raised drain contact regions 132a-

132b are epitaxially grown from the sidewalls of the first semiconductor fins 118a and second semiconductor fins 118b, respectively. The duration of the epitaxial growth process can be continued over a time period such that the epitaxial material grows laterally from the sidewalls of the semiconductor fins 118a to form merged source contact regions 130a and merged drain contact regions 132a. In a similar manner, the epitaxial material can be grown laterally from sidewalls of the semiconductor fins 118b formed in the nFET region to form merged source contact regions 130b and merged drain contact regions 132b. In this manner, the height of the merged source/drain contact regions 130a-132a is different from the height of the merged source/drain contact regions 130b-132b as further illustrated in FIG. 9C.

According to a non-limiting embodiment, the epitaxial material grown in the pFET region is different from the epitaxial material grown in the nFET region. For example, the merged source/drain contact regions 130a-132a grown in the nFET region can be formed from silicon (Si) or silicon carbide (SiC) doped with n-type dopants, while the merged source-drain contact regions 130b-132b grown in the pFET region are formed from silicon (Si) or silicon germanium (SiGe) doped with p-type dopants. Dopants can be incorporated into the source/drain epitaxy layer by in-situ doping (dopants incorporation during epitaxy), by ex-situ (for example, ion implantation after epitaxy), or a combination of both. According to another embodiment, however, the semiconductor fins 118a-118b are formed as a common FET-type device (i.e., a common nFET or a common pFET). In this case, the merged epitaxial source/drain regions 130a-132a/130b-132b are formed from the same epitaxial material.

According to various non-limiting embodiments described in detail above, a finFET semiconductor device is provided including a plurality of semiconductor fins having varied fin heights. Accordingly, a greater drive current can be delivered through a first plurality of semiconductor fins having an increased height with respect to a second plurality of semiconductor fins such that a non-integral ratio can be achieved. Moreover, since the upper surfaces of the second and third epitaxially grown materials are formed flush with one another during the fabrication process, the final semiconductor device includes a plurality of semiconductor fins including upper semiconductor portions having different heights but having a total fin height that is substantially equal to one another is provided. Accordingly, the upper surfaces of the semiconductor fins in both the pFET region and the nFET region are substantially aligned with one another along a horizontal axis such that variations in gate stack topography between the nFET region and the pFET region are avoided.

As used herein, the term module refers to a hardware module including an Application Specific Integrated Circuit (ASIC), an electronic circuit, a processor (shared, dedicated, or group) and memory that execute one or more software or firmware programs, a combinational logic circuit, and/or other suitable components that provide the described functionality.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of fabricating a finFET semiconductor device, the method comprising:
   forming a plurality of semiconductor fins on a semiconductor substrate, at least one first semiconductor fin among the plurality of semiconductor fins including a first lower semiconductor portion and a first upper semiconductor portion, and at least one second semiconductor fin including a second lower semiconductor portion and a second upper semiconductor portion;
   etching the first lower semiconductor portion to form a first cavity having a first cavity height extending between the semiconductor substrate and a first upper semiconductor portion, and etching the second lower semiconductor portion to form a second cavity height extending between the semiconductor substrate and a second upper semiconductor portion, the second cavity height being different from the first cavity height; and
   filling the first cavity and the second cavity with an insulator material such that a first height of the first upper semiconductor portion is different than a second height of the second upper semiconductor portion.

2. The method of claim 1, wherein a combination of the insulator material and the first upper semiconductor portion defines a first total height of the at least one first semiconductor fin, and a combination of the insulator material and the second upper semiconductor portion defines a second total height of the at least one second semiconductor fin.

3. The method of claim 2, wherein the first total height is substantially equal to the second total height such that a first top of the at least one first semiconductor fin is at a same level as a second top of the at least one second semiconductor fin.

4. The method of claim 3, wherein etching the first cavity comprises selectively etching the first and second lower semiconductor portions with respect to the first and second upper semiconductor portions, respectively, such that the first and second upper semiconductor portions are suspended over the semiconductor substrate.

5. The method of claim 4, wherein forming the plurality of semiconductor fins comprises:
    forming a first semiconductor layer comprising a first semiconductor material on an upper surface of a bulk substrate layer of the semiconductor substrate;
    forming a second semiconductor layer comprising a second semiconductor material on an upper surface of the first semiconductor layer, the second semiconductor material being different from the first semiconductor material; and
    patterning the semiconductor substrate to form the plurality of semiconductor fins such that the first and second lower semiconductor portions comprise the first semiconductor material and the first and second upper semiconductor portions comprise the second semiconductor material.

6. The method of claim 5, wherein forming the plurality of semiconductor fins further comprises prior to patterning the semiconductor substrate, etching a first region of the first semiconductor layer and the second semiconductor layer with respect to a second region of the first semiconductor layer and the second semiconductor layer, and forming in the etched second region a third semiconductor material having an upper surface that is flush with an upper surface of the second semiconductor layer of the first region.

7. The method of claim 6, wherein the first semiconductor layer is epitaxial grown from the upper surface of the semiconductor material, and the second semiconductor layer is epitaxially grown from the upper surface of the first semiconductor layer.

8. The method of claim 7, wherein the third semiconductor layer is epitaxially grown from the first semiconductor layer of the first region, and the sidewalls of the first and second semiconductor layers of the second region.

9. The method of claim 8, wherein selectively etching the first and second lower semiconductor portions includes performing a reactive ion etch on the at least one first and second semiconductor fins that is selective to the second and third semiconductor materials.

10. The method of claim 9, wherein the first semiconductor material is silicon germanium (SiGe), the second semiconductor material is silicon (Si), and the third semiconductor material is one of Si or SiGe having a percentage of germanium (Ge) that is less than a percentage of Ge of the first semiconductor material.

11. The method of claim 10, wherein the insulator material is silicon dioxide ($SiO_2$).

12. The method of claim 11 further comprising forming a gate stack on the semiconductor substrate prior to etching the first and second cavities, the gate stack wrapping completely around the outer surfaces of the plurality of semiconductor fins.

13. The method of claim 12, wherein the first and second cavities are etched after forming the gate stack such that a remaining portion of the gate stack anchors the suspended first and second upper semiconductor portions.

* * * * *